(12) United States Patent
Dudde et al.

(10) Patent No.: US 8,716,413 B2
(45) Date of Patent: May 6, 2014

(54) PHOTOCURABLE COMPOSITION

(75) Inventors: Kai Dudde, Weil am Rhein (DE); Sabine Pierau, Freiburg (DE); Martin Roth, CH-Hoelstein (CH)

(73) Assignee: Huntsman Advanced Materials Americas LLC, The Woodlands, TX (US)

( * ) Notice: Subject to any disclaimer, the term of this patent is extended or adjusted under 35 U.S.C. 154(b) by 382 days.

(21) Appl. No.: 13/120,457

(22) PCT Filed: Jun. 12, 2009

(86) PCT No.: PCT/EP2009/057269
§ 371 (c)(1),
(2), (4) Date: Mar. 23, 2011

(87) PCT Pub. No.: WO2010/034531
PCT Pub. Date: Apr. 1, 2010

(65) Prior Publication Data
US 2011/0200950 A1    Aug. 18, 2011

(30) Foreign Application Priority Data
Sep. 25, 2008   (EP) ................................ 08165135

(51) Int. Cl.
*C08L 63/00* (2006.01)
(52) U.S. Cl.
USPC ........... 525/524; 525/523; 525/529; 525/530; 525/531

(58) Field of Classification Search
USPC .......................... 525/523, 524, 529, 530, 531
See application file for complete search history.

(56) References Cited

U.S. PATENT DOCUMENTS

| | | | |
|---|---|---|---|
| 5,576,399 A * | 11/1996 | Roth et al. | 525/531 |
| 6,077,879 A | 6/2000 | Ohtsuki et al. | |
| 2003/0219588 A1 | 11/2003 | Ogawa et al. | |
| 2006/0270810 A1 * | 11/2006 | Yasumura et al. | 525/529 |
| 2007/0027298 A1 | 2/2007 | Minegishi | |

FOREIGN PATENT DOCUMENTS

| | | |
|---|---|---|
| EP | 0556429 | 8/1993 |
| EP | 0587189 | 3/1994 |
| JP | 10001596 | 1/1998 |
| WO | WO 2004/081621 | 9/2004 |

* cited by examiner

*Primary Examiner* — Robert Jones, Jr.

(57) ABSTRACT

A method for the preparation of a photocurable resin by a reaction comprising the following steps i) reacting a mixture of a novolak type epoxy resin (A) and a dicyclopentadiene-phenol glycidylether resin (B) with ii) an advancement component (C) containing at least 2 phenolic hydroxyl groups per molecule; iii) reacting with an unsaturated monocarboxylic acid (D); and iv) esterification of the unsaturated group containing resin obtained from the steps of i) to iii) with a polycarboxylic acid anhydride or a carboxylic acid anhydride (E) is disclosed.

10 Claims, No Drawings

PHOTOCURABLE COMPOSITION

CROSS REFERENCE TO RELATED APPLICATIONS

This application is the National Phase of International Application PCT/EP2009/057269 filed Jun. 12, 2009 which designated the U.S. and which claims priority to European (EP) Pat. App. No. 08165135.8 filed Sep. 28, 2008. The noted applications are incorporated herein by reference.

FIELD OF THE INVENTION

The invention relates to a method for the preparation of a resin composition as well as a photocurable resin composition obtainable by the method. Further, the invention relates to a method of forming a resist pattern as well as the use of the photocurable composition as a solder resist, etch resist, resist for additive plating, coating or adhesive.

BACKGROUND OF THE INVENTION

In the production of printed circuits, a protective film is applied to a printed circuit board in order to protect the electrical circuit and to prevent adhesion of solder material in undesired areas when electrical parts are being soldered onto the printed circuit board. The demand for light circuit boards while having a high density of circuits requires compositions having good adhesion properties, chemical stabilities and good electrical properties.

Conventional heat-curable and photopolymerizable compositions frequently comprise an epoxy compound and a photosensitive prepolymer. If such a composition is developed in an alkaline solution after drying and exposure, the unexposed parts of the photosensitive prepolymer are only poorly soluble. Moreover, the epoxy compound frequently reacts with the epoxide curing agent as early as during the drying step, which decreases the ability of development and leads to a poorly developable layer on the copper surface.

EP-A1-587 189 discloses a photocurable liquid solder resist ink composition comprising a photopolymerization initiator, a diluent and a photopolymerizable resin which is obtainable by reacting a novolak-type epoxy resin having 4 or more benzene nuclei with both (meth)acrylic acid and a chain-extension agent having 2 to more functional groups reactable with the hydroxyl groups and/or epoxy groups.

U.S. Pat. No. 6,077,879 discloses a radically polymerizable curable resin obtained by the reaction of an epoxy resin having 2 or more epoxy groups with a phenol compound having an alcoholic hydroxy group which is further reacted with unsaturated monobasic acid and an anhydride of a polybasic acid.

WO-A1-2004/081621 discloses a photosensitive resin composition for a colour filter wherein the photosensitive composition comprises a binder resin which is obtainable by a cyclopentadiene-novolak epoxy resin with an unsaturated carboxylic acid and an anhydride of a polybasic acid.

EP-A1-556 429 discloses an epoxy resin composition comprising a cyclopentadiene-novolak epoxy resin, at least a phenolic hydroxyl-containing compound and an epoxy-containing component which is different from the dicyclopentadiene-novolak epoxy resin.

JP-10-001596 discloses an acid group-containing epoxy vinyl ester resin obtainable by (i) a cyclopentadiene-novolak epoxy resin with (ii) an ethylenically unsaturated monobasic acid, followed by reacting the resulting epoxy vinyl ester resin with (iii) a polybasic anhydride to modify the OH of the resulting resins.

Solder resist compositions known in the prior art suffer from a poor ability to be developed and, additionally, they are too brittle, which leads to cracks under thermally changing conditions. In particular, for automotive applications solder masks are required which are stable under changing temperature conditions. Likewise, it is required that the solder mask has a high dielectric strength and an excellent moisture insulation resistance and does not suffer from electrochemical corrosion. Depending on the field of application the solder resist composition must additionally be stable under conditions applied during the immersion of nickel/gold as well as tin. Higher environmental standards in the automotive industry require lead-free solders which, however, have a higher melting point (up to 290° C.). Therefore, solder resist compositions are required which have an excellent solder resistance and high temperature resistance respectively.

Surprisingly, a photocurable composition has been found which overcomes the above-mentioned problems in the prior art. In particular a photocurable composition has been found which demonstrate an increased heat resistance and solder resistance respectively.

SUMMARY OF THE INVENTION

A first embodiment of the present invention is a method for the preparation of a photocurable resin by a reaction comprising the following steps:

i) reacting a mixture of a novolak type epoxy resin (A) represented by formula (I)

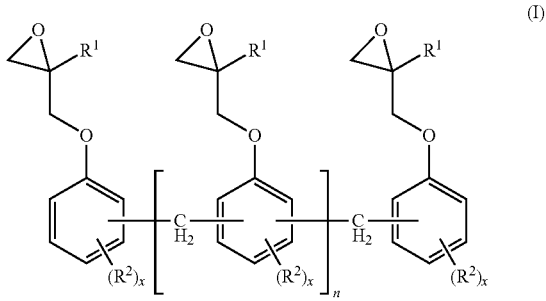

(I)

wherein $R^1$ is independently selected from H or $CH_3$; $R^2$ is independently selected from $C_{1-4}$-alkyl or halogen; x is an integer from 0 to 2; n is an integer from 2 to 12;

and a dicyclopentadiene-phenol glycidylether resin (B) represented by formula (II)

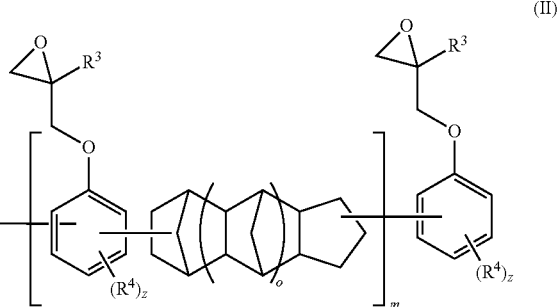

(II)

wherein $R^3$ is independently selected from H or $CH_3$; $R^4$ is independently selected from $C_{1-4}$-alkyl or halogen; z is an integer from 0 to 2; m is an integer from 0 to 10; o is an integer from 0 to 2 with ii) an advancement component (C) containing at least 2 phenolic hydroxyl groups per molecule;
iii) reacting with an unsaturated monocarboxylic acid (D); and
iv) esterification of the unsaturated group containing resin obtained from the steps of i) to iii) with a polycarboxylic acid anhydride or a carboxylic acid anhydride (E).

Component (A):

The novolak-type epoxy resin (A) is represented by formula (I)

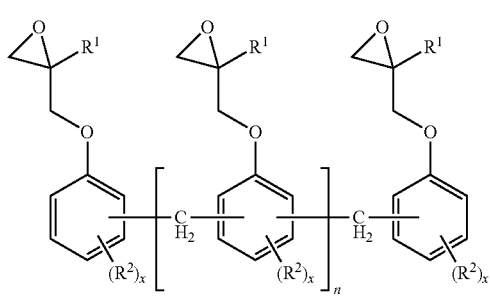

(I)

wherein $R^1$ is independently selected from H or $CH_3$; $R^2$ is independently selected from $C_{1-4}$-alkyl or halogen; x is an integer from 0 to 2; n is an integer from 2 to 12.

Preferably, $R^2$ is independently selected from methyl or bromine. Furthermore, it is preferred that the substituent $R^2$ is in the ortho- or para-position relative to the glycidyl ether moiety.

The novolak type epoxy resin (A) is preferably an epoxy cresol novolak.

Novolak-type epoxy resin which are suitable for the method according to the present invention are commercially available, e.g., ECN (epoxy cresol novolac) resins from Huntsman or EOCN (o-cresol novolak epoxy) resins from Nippon Kayaku.

Component (B):

The dicyclopentadiene-phenol glycidylether resin (B) used in the method according to the present invention is represented by formula (II)

wherein $R^3$ is independently selected from H or $CH_3$; $R^4$ is independently selected from $C_{1-4}$-alkyl or halogen; z is an integer from 0 to 2; m is an integer from 0 to 10; o is an integer from 0 to 2.

Preferably, $R^4$ is independently selected from methyl or bromine. According to a preferred embodiment $R^4$ is in the ortho- or para-position relative to the glycidyl ether moiety. The dicyclopentadiene-phenol glycidylether resin represented by formula (II) can be obtained by the polyaddition of dicyclopentadiene and a phenol which is optionally substituted with one or more substituents $R^4$.

The epoxy resin (B) is preferably a glycidylated dicyclopentadiene-phenol addition product.

The dicyclopentadiene-phenol glycidylether resin (B) is commercially available from Huntsman, e.g., TACTIX® 556 and TACTIX® 756 or from Dainippon Inc., e.g., EPICLON® HP-7200 H and EPICLON® HP-7200 HH.

The weight ratio of novolak type epoxy resin (A) to dicyclopentadiene-phenol glycidylether resin (B) is preferably from 9:1 to 1:9, more preferably from 9:1 to 1:1, most preferably from 5:1 to 2:1.

The advancement component (C) used in the method for the preparation of the photocurable resin is a component containing at least 2 phenolic hydroxyl groups per molecule.

The advancement component (C) is preferably selected from hydrochinone, resorcinol, catechol, or from bisphenols of formula (III),

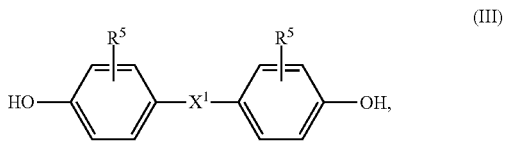

(III)

wherein $R^5$ independently hydrogen, dialkylamino; alkylthio; alkylsulfonyl; $C_1$-$C_{18}$ alkyl; $C_1$-$C_{18}$ alkenyl; alkoxy; $C_1$-$C_{18}$ alkoxy-$C_1$-$C_{18}$-alkylene; $C_5$-$C_{12}$ cycloalkyl which is unsubstituted or substituted by one or more $C_1$-$C_6$ alkyl groups or $C_1$-$C_6$ alkoxy groups; $C_6$-$C_{12}$ aryl which is unsubstituted or substituted by one or more $C_1$-$C_6$ alkyl groups or $C_1$-$C_6$ alkoxy groups; or $C_6$-$C_{12}$ aryl-$C_1$-$C_{18}$-alkylene wherein the aryl moiety is unsubstituted or substituted by one or more $C_1$-$C_6$ alkyl groups or $C_1$-$C_6$ alkoxy groups;

$X^1$ is a bivalent bridging group selected from —O—, —S—, —S(O)—, —S(O)$_2$—, —C(O)—, —NR$^6$—, —O—C(O)—, —O—C(O)—O—, —SO$_2$—O—, —O—SO$_2$—O—, $C_1$-$C_{18}$ alkylene, $C_2$-$C_{18}$ alkenediyl,

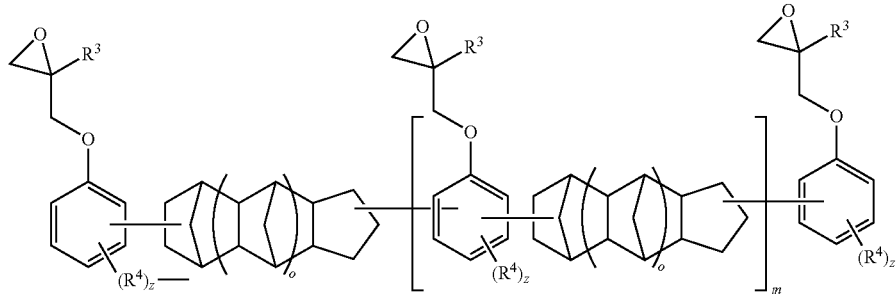

(II)

$C_3$-$C_{12}$ cycloalkylene, $C_5$-$C_{12}$ cycloalkenediyl, —Si(OR$^6$)$_2$— and —Si(R$^6$)$_2$—; and R$^6$ is H, $C_1$-$C_{12}$ alkyl, $C_5$ or $C_6$ cycloalkyl, $C_5$ or $C_6$ cycloalkyl substituted with methyl, ethyl, phenyl, benzyl or phenyleth-2-yl.

R$^5$ is in particular hydrogen or $C_1$-$C_4$ alkyl, such as methyl or ethyl.

X$^1$ preferably is a direct bond or a bivalent bridging group selected from —O—, —S—, —S(O)$_2$—, —C(O)—, —NR$^6$, $C_1$-$C_4$ alkylene (for example methylene or 1,2-ethylene), $C_2$-$C_6$ alkenediyl (for example ethenediyl, 1,1- or 2,2-propenediyl, 1,1- or 2,2-butenediyl, 1,1-, 2,2- or 3,3-pentenediyl, or 1,1-, 2,2- or 3,3-hexenediyl) or $C_5$-$C_8$ cycloalkenediyl (for example cyclopentenediyl, cyclohexenediyl or cyclooctenediyl), whereby R$^6$ is preferably hydrogen or $C_1$-$C_4$ alkyl.

The advancement component (C) is more preferably selected from the group consisting of bisphenol A, bisphenol F, bisphenol S or resorcinol.

The amount of component (C) used in the method according to the present invention is preferably 0.01 to 0.10 mol, more preferably 0.02 to 0.09 mol, most preferably 0.03 to 0.07 mol, based on one chemical equivalent of epoxy groups from the mixture comprising components (A) and (B).

The advancement reaction which is the reaction of the mixture comprising components (A) and (B) with the advancement component (C) in step ii) of the method is preferably conducted at a temperature range from 80° C. to 160° C. The advancement reaction is preferably carried out in the presence of a catalyst. Suitable catalysts are selected from the group consisting of quaternary ammonium salts, quaternary phosphonium salts, tertiary amine or imidazole compounds.

The advancement reaction leads to a broadening of the molecular weight distribution towards higher molecular weights and, as a consequence, leads to an increased average molecular weight of the resin.

Step iii) of the method for the preparation of the photocurable resin according to the present invention is a reaction step wherein an unsaturated monocarboxylic acid (D) is reacted with the epoxy groups of the mixture comprising a novolak-type epoxy resin (A) and the dicyclopentadiene-phenol glycidylether resin (B) and/or the unsaturated monocarboxylic acid (D) is reacted with the epoxy groups of the advanced epoxy resin mixture comprising (A) and (B) which have already been reacted with component (C).

The unsaturated monocarboxylic acid (D) is preferably selected from the group consisting of crotonic acid, cinnamic acid, methacrylic acid or acrylic acid.

The reaction of the unsaturated carboxylic acids (D) with the advanced or not advanced epoxy resin mixture comprising (A) and (B) is preferably carried out at a temperature from 80° C. to 140° C. The reaction is preferably conducted in the presence of a catalyst which is preferably selected from the group consisting of chromium salts, triphenylphosphine, amines, such as triethylamine or benzyldimethylamine, ammonium or phosphonium salts.

Furthermore, advantageously, during the reaction step iii) a polymerization inhibitor is added to the reaction mixture. The polymerization inhibitor is preferably selected from the group consisting of hydrochinone, hydrochinone monomethylether or 2,6-di-tert-butyl-p-cresol.

The amount of unsaturated monocarboxylic acid (D) is preferably chosen such that at least an equimolar amount of carboxyl groups relative to the epoxy groups present is used in the reaction mixtures. In a preferred embodiment of the present method, a molar excess of 1.05 to 1.2 equivalents of epoxy groups present in the reaction mixture is used in order to avoid gelation during the further reaction with an anhydride.

According to a preferred embodiment of the method of the present invention step ii) is carried out after step iii) or steps ii) and iii) are conducted at the same time.

Step iv) of the method according to the present invention is an esterification of the unsaturated group containing photocurable resin composition obtained from steps of i) to iii) with a polycarboxylic acid anhydride or a carboxylic acid anhydride (E).

The carboxylic acid anhydride (E) is preferably selected from the group consisting of succinic anhydride, maleic anhydride, glutaric anhydride, tetrahydrophtalic anhydride, itaconic anhydride, phthalic anhydride, hexahydrophthalic anhydride, methyl- or ethyl-hexahydrophthalic anhydride, methyl- or ethyl-tetrahydrophthalic anhydride.

Reaction step iv) of the method according to the present invention can be conducted by general methods known to the person skilled in the art. The reaction of the carboxylic acid anhydrides lead to a half-esterification with the hydroxyl groups present in the photocurable resin obtained by the reaction steps i) to iii). The amount of the carboxylic groups present in the photocurable composition contained after step iv) determines the solubility in an aqueous alkaline developer and can be adjusted by choosing the respective molar amount of carboxylic anhydride (E). The reaction can be conducted under the same temperature conditions as reaction step iii). Preferably, the reaction is conducted in the presence of catalysts which are preferably selected from the group consisting of amines such as triethylamine, pyridine or dimethylaminopyridine.

A further embodiment of the present invention is a photocurable resin which is obtainable by the method according to the present invention.

Preferably the acid value which can be controlled by the amount of carboxylic acid anhydride (E) used in the method according to present invention is from 0.7 to 0.9 equivalents per kg.

A further embodiment of the present invention is a photocurable composition comprising the photocurable resin of the present invention, a photopolymerization initiator and a diluent. The photocurable composition is preferably used as a photocurable resist ink composition.

A diluent, which is a photopolymerizable vinyl monomer or a combination of a photopolymerizable vinyl monomer with an organic solvent, is preferably added to the photocurable composition according to the invention.

The photopolymerizable vinyl monomers are preferably selected from the group consisting of hydroxyalkyl acrylates, such as 2-hydroxyethyl acrylate, 2-hydroxybutyl acrylate and the like; mono- or diacrylates of glycol, such as ethylene glycol, methoxytetraethylene glycol, polyethylene glycol, propylene glycol and the like, ethylene glycol diacrylate, diethylene glycol diacrylate and the like; acrylamides, such as N,N-dimethylacrylamide, N-methylolacrylamide, methylenebisacrylamide, diethylenetriaminetriacrylamide, bisacrylamidopropoxyethane, bismethacrylamidoethyl methacrylate, N-[(β-hydroxyethyloxy)ethyl]acrylamide and the like; aminoalkyl acrylates, such as N,N-dimethylaminoethyl acrylate and the like; polyvalent acrylates of polyols, such as hexanetriol, trimethylolpropane, pentaerythritol, dipentaerythritol, trihydroxyethyl isocyanurate and the like, and ethylene oxide adducts thereof or propylene oxide adducts; phenoxyacrylates, bisphenol A diacrylate and acrylates of ethylene oxide adducts and propylene oxide adducts of these phenols; acrylates of glycidyl ethers, such as glyceryl diglycidyl ether, trimethylolpropane triglycidyl ether, triglycidyl isocyanurate and the like; melamine acrylate; and methacrylates of the above-mentioned acrylates; etc.

The organic solvents are preferably selected from the group consisting of the ketones, such as methyl ethyl ketone, cyclohexanone and the like; aromatic hydrocarbons, such as toluene, xylene, tetramethylbenzene and the like; glycol ethers, such as methylcellosolve, butylcellosolve, methylcarbitol, butylcarbitol, propylene glycol monomethyl ether, dipropylene glycol monoethyl ether, triethylene glycol monoethyl ether and the like; esters, such as ethyl acetate, butyl acetate, acetates of the above-mentioned glycol ethers and the like; alcohols, such as ethanol, propanol, ethylene glycol, propylene glycol and the like; aliphatic hydrocarbons, such as octane, decane and the like; and petroleum solvents, such as petroleum ether, petroleum naphtha, hydrogenated petroleum naphtha, naphtha solvents and the like. The organic solvents can be used to reduce the viscosity of the composition according to the invention, which leads to an improvement in its application properties.

The diluent may be used alone or as a mixture of a plurality of diluents. The composition according to the invention can comprise up to 15% by weight of the diluent, based on the overall weight of the photocurable composition according to the invention.

Vinylmonomers are preferably used as a diluent since not only the viscosity of photocurable composition is reduced but at the same time the photopolymerization rate is increased.

The photopolymerizable composition further comprises a photopolymerization initiator. Typical examples of photopolymerization initiators are benzoin and benzoin alkyl ethers, such as benzoin, benzil, benzoin methyl ether, benzoin ethyl ether, benzoin n-propyl ether, benzoin n-butyl ether, benzoin isopropyl ether and the like; benzophenones, such as benzophenone, p-methylbenzophenone, Michler's ketone, methylbenzophenone, 4,4'-dichlorobenzophenone, 4,4-bisdiethylaminobenzophenone and the like; acetophenones, such as acetophenone, 2,2-dimethoxy-2-phenylacetophenone, 2,2-diethoxy-2-phenylacetophenone, 1,1-dichloroacetophenone, 1-hydroxycyclohexyl phenyl ketone, 2-methyl[4-(methylthio)phenyl]-2-morpholino-1-propanone, N,N-dimethylaminoacetophenone and the like; thioxanthone and xanthones, such as 2,4-dimethylthioxanthone, 2,4-diethylthioxanthone, 2-chlorothioxanthone, 2,4-diisopropylthioxanthone and the like; anthraquinones, such as anthraquinone, chloroanthraquinone, 2-methylanthraquinone, 2-ethylanthraquinone, 2-tert-butylanthraquinone, 1-chloroanthraquinone, 2-amylanthraquinone, 2-aminoanthraquinone and the like; ketals, such as acetophenone dimethyl ketal, benzyl dimethyl ketal and the like; benzoic esters, such as ethyl 4-dimethylaminobenzoate, 2-(dimethylamino)ethyl benzoate, ethyl-p-dimethylaminobenzoate and the like; phenyl disulphides, 2-nitrofluorene, butyloin, anisoin ethyl ether, azobisisobutyronitriles, tetramethylthiuram disulphide and the like. These compounds may be present individually or in combination in the composition according to the invention.

The photopolymerization initiator is preferably present in an amount of from 0.1 to 10 percent by weight, based on the composition according to the invention.

The photocurable composition according to the invention may also comprise inorganic and/or organic fillers in order to improve the adhesion properties or the hardness of the layer. The inorganic fillers are preferably selected from the group consisting of barium sulphate, barium titanate, pulverized silica, finely pulverized silica, amorphous silica, talc, chalk, magnesium carbonate, calcium carbonate, alumina, aluminium hydroxide, mica powder and the like. The composition according to the invention comprises up to 40 percent by weight, preferably 5-30 percent by weight, of inorganic fillers, based on the photocurable composition according to the invention.

The photocurable resin composition according to the invention may also comprise additives, such as colorants, thickeners, antifoaming agents, levelling agents, thermal polymerization inhibitors or antioxidants. Possible colorants are phthalocyanine blue, phthalocyanine green, iodine green, diazo yellow, crystal violet, titanium oxide, carbon black, naphthalene black and the like. Possible thermal polymerization inhibitors are hydroquinone, hydroquinone monomethyl ether, tert-butylcatechol, pyrogallol, phenothiazine and the like. Suitable thickeners are, for example, bentone, montmorillonite and the like. Suitable antifoaming agents are, for example, fluorosilicone-like, fluoride-like or polymer-like antifoams.

A further embodiment of the invention is a method of forming a resist pattern comprising the following steps:
(a) providing a photocurable composition according to the present invention;
(b) applying said photocurable composition on a printed circuit board;
(c) heat-drying said photocurable composition and forming a photoresist layer on the board;
(d) selectively exposing said photoresist layer with light to cure an exposed portion thereof; and
(e) developing the photoresist layer by removing a non-exposed portion thereof.

In the production of a circuit board comprising a layer, such as, for example, a solder resist mask, the printed circuit board is first coated with the photocurable composition according to the invention, dried to evaporate the diluent (60 to 90° C. for 15 to 60 minutes) resulting in the formation of a layer. This layer is then selectively exposed, preferably by using a patterned negative mask. After the exposure, the layer is developed with a developing liquid in order to remove the unexposed parts of the layer. Finally, the layer is postcured by heating thus obtaining, a solder resist mask serving as protective layer on the circuit board. The heat treatment for the postcuring can be carried out at from 100 to 180° C., preferably from 130 to 160° C.

A further embodiment is a photocured composition obtainable by photocuring the photocurable resin according to the present invention or the photocurable resin composition according to the present invention.

A further embodiment of the present invention is the use of the photocurable resin according to the present invention as a solder resist, etch resist, resist for additive plating, coating, adhesive, or a resin for a stereolithography application.

The following examples explain the invention in more detail. The amounts of components referred are mentioned as parts by weight.

EXAMPLE (I) Photocurable Composition According to the Present Invention (a1) Advancement Reaction Apparatus: 1500 ml-chemical reactor equipped with stirrer, thermometer, gas in- and outlet, heating bath. The reaction is conducted under a nitrogen blanket.

300.00 g (1.3704 equivalents of epoxy groups) of epoxy cresol novolak EOCN 104S (I, from Nippon Kayaku) and 100.00 g (0.3966 equiv. of epoxy groups) of glycidylated cyclopentadiene-phenol addition product Tactix 756 (II, from Huntsman) and 21.60 g (0.1079 mol) bisphenol F (III, from Honshu Chemical) are charged and dissolved in 181.20 g diethylenglycol ethylether acetate (DEA) by heating to 120° C. Then 0.40 ml of a 5%-solution of tetramethylammonium chloride in ethanol are added and the reaction mixture is heated to 130° C. and stirred at 130° C. for 7 hours to yield the advanced epoxy resin mixture. Calculated solid content is 70% solids.

Analytical Data:

| | |
|---|---|
| Epoxy value (titrated) | 2.602 equiv./kg |
| GPC (gel permeation chromatography; polystyrene calibration) | Mw/Mn = 28735/1081 |

(a2) Acrylation of Advanced Epoxy Resin Mixture Obtained from (a1)

Apparatus: same as (a1); the reaction is conducted under a blanket of a gas mixture of 8% $O_2$ in $N_2$.

To 600 g of the advanced epoxy resin mixture obtained according to (a1), (1.5612 equiv. of epoxy groups), 50.10 g DEA and 1.07 g of 2,6-di-tert.butyl-p-cresol are added and heated to 105° C. Then 114.75 g (1.5924 mol) of acrylic acid and 1.07 g of $Cr^{III}$ isooctanoate (Hexcem) (from Vasset) are added and the reaction mixture is kept for 4 hours at 105°-110° C. At the beginning the reaction is exothermic and needs cooling to keep the temperature below 110° C. This leads to the acrylated resin.

Analytical Data:

| | |
|---|---|
| Epoxy value (titrated) | 0.012 equiv./kg |
| Acid value (titrated) | 0.004 equiv./kg |
| GPC (gel permeation chromatography; polystyrene calibration) | Mw/Mn = 46449/1395 |

(a3) Half-Esterifying of the Acrylated Resin Obtained from (a2)

Apparatus: same as before; the reaction is run under a blanket of a gas mixture of 8% $O_2$ in $N_2$.

675 g of the acrylated reaction product obtained according to (a2), (1.5580 equiv. of OH groups from the acrylic acid addition) are added to 218.00 g DEA, followed by the addition of 135.05 g (0.8876 mol) tetrahydrophthalic anhydride and 0.33 g dimethylamino pyridine. The reaction mixture is stirred for 6.5 hours at 105° C. and then 0.33 g hydroquinone monomethylether are added.

Analytical Data:

| | |
|---|---|
| Yield | 1054 g |
| Solid content | 58.69% |
| Acid value (titrated) | 0.854 equiv./kg |
| GPC (gel permeation chromatography; polystyrene calibration) | Mw/Mn = 69106/1200 |

(II) Comparative Photocurable Composition According to the Prior Art—without Cyclopentadiene Novolak Resin (B)

(b1) Advancement Reaction

Apparatus: 30-liter chemical reactor equipped with stirrer, thermometer, gas in- and outlet, heating bath. The reaction is run under a nitrogen blanket.

10957.60 g (50.31 equivalents of epoxy groups) of epoxy cresol novolak EOCN 104S (I, from Nippon Kayaku) and 201.50 g (1.01 mol) Bisphenol F (III, from Honshu Chemical) are charged and dissolved in 4782.00 g diethylenglycol ethylether acetate (DEA) by heating to 120° C. Then 11.00 ml of a 5%-solution of tetramethylammonium chloride in ethanol are added and the reaction mixture is heated to 130° C. and stirred at 130° C. for 7 hours to yield the advanced epoxy resin. Calculated solid content is 70% solids.

Analytical Data:

| | |
|---|---|
| Epoxy value (titrated) | 3.021 equiv./kg |
| GPC (gel permeation chromatography; polystyrene calibration) | Mw/Mn = 7388/1239 |

(b2) Acrylation of Resin According to (b1)

Apparatus: same as (b1); the reaction is run under a blanket of a gas mixture of 8% $O_2$ in $N_2$. 15.940 g of the reaction product obtained according to (b1), (48.15 equiv. of epoxy groups), are added to 1522.10 g DEA and 29.40 g of 2,6-di-tert.butyl-p-cresol and heated to 100° C. Then 354.00 g (4.91 mol) of acrylic acid and 29.40 g of 8% $Cr^{III}$ isooctanoate (Hexcem) (from Vasset) are added and the mixture is heated to 105° C., at which temperature the exothermic reaction started. To the green-coloured solution 3185.40 g (44.20 mol) of acrylic acid was added within 1 hour, keeping the reaction temperature below 110° C. by occasional cooling. The green-coloured reaction mixture was heated and stirred for 4 hours at 108°-110° C. and then cooled to ambient temperature. The analytical properties of this acrylated resin are as follows.

Analytical Data:

| | |
|---|---|
| Epoxy value (titrated) | 0.020 equiv./kg |
| Acid value (titrated) | 0.042 equiv./kg |
| GPC (gel permeation chromatography; polystyrene calibration) | Mw/Mn = 10'836/1662 |

(b3) Half-Esterifying of the Resin Prepared According to (b2)

Apparatus: same as before; the reaction is run under a blanket of a gas mixture of 8% $O_2$ in $N_2$. 21.055 g of the reaction product obtained according to (b2), (48.14 equiv. of OH groups from the acrylic acid addition), are added to 6107.00 g DEA, followed by addition of 3662.50 g (24.07 mot) tetrahydrophthalic anhydride and 9.20 g dimethylamino pyridine. The reaction mixture is heated to 108-110° C. and stirred for 4 hours at this temperature. 9.20 g of hydroquinone monomethylether are added to yield the comparative binder polymer, which showed the following analytical properties:

Analytical Data:

| | |
|---|---|
| Yield | 30'300.00 g |
| Solid content | 59.43% |
| Acid value (titrated) | 0.8664 equiv./kg |
| Viscosity @ 25° C. (Brookfiled viscosimeter, spindle 31) | 14'037 mPa · s |

TABLE 1

| | Explanation |
|---|---|
| Resin 1 | Comparative resin without Tactix according to example B (II) |
| Resin 2 | Photocurable resin according to Example (I) |
| Resin 3 | Epoxy acrylate mixture of binder A with CASNR: 18297-62-7 and binder B with CASNR: 126901-56-2 |
| Resin 4 | Acrylic resin with unsaturated groups CAS: 344779-14-2 |

TABLE 2

Photocurable compositions
The amounts of components are mentioned in parts per weight.

| | Example No. | | | | |
|---|---|---|---|---|---|
| | 1 | 2 | 3 (comparative) | 4 (comparative) | 5 (comparative) |
| Resin 1 | | | 57 | | |
| Resin 2 | 57 | 60 | | | |
| Resin 3 | | | | 17 | 13 |
| Resin 4 | | | | 35 | 38 |
| Defoamer | 1.4 | 1.5 | 0.9 | 1.2 | 1.1 |
| Fused silica | 5 | 2 | 5 | 5.7 | 12 |
| Dicyandiamide | 1 | 1 | 1 | 1 | 0.8 |
| Talcum | 1 | 1 | 1.2 | 2 | 0.9 |
| IRGACURE ® 369[3)] | 2 | 1.8 | 2 | 1.3 | 1.5 |
| IRGACURE ® 907[4)] | 1.4 | 0.7 | 1.3 | 2.8 | 0.7 |
| 2,4 Isopropyl-thioxanthone(ITX) | 0.3 | 0.2 | 0.2 | 0.7 | 0.5 |
| Bariumsulfate | 18.5 | 18 | 19 | 17 | 12 |
| Phthalocyanine green | 0.4 | 0.3 | 0.4 | 0.3 | 0.3 |
| Dipentaerythritol pentaacrylate | | | | 5 | 4.7 |
| Ethoxylated (3) trimethylpropane triacrylate[1)] | | | | 3 | |
| trimethylpropane triacrylate | | | | | 5.5 |
| Ethoxylated (4) pentaerythritol tetraacrylate[2)] | 4 | 4.5 | 4 | | |
| Bisphenol A epoxy liqide resin | 8 | 9 | 8 | | |
| diglycidylether of tetramethylbiphenol | | | | 8 | 9 |
| total | 100 | 100 | 100 | 100 | 100 |

[1)]trimethylpropane triacrylate which is on average ethoxylated with 3 ethoxy groups
[2)]pentaerythritol tetraacrylate which is on average ethylated with 4 ethoxy groups
[3)]photoinitiator: 2-Benzyl-2-dimethylamino-1-(4-morpholinophenyl)-butanone-1
[4)]photoinitiator: 2-Methyl-1[4-(methylthio)phenyl]-2-morpholinopropan-1-one

TABLE 3

Comparison of the properties of the compositions of Table 2

| | Example No. | | | | |
|---|---|---|---|---|---|
| | 1 | 2 | 3 (comparative) | 4 (comparative) | 5 (comparative) |
| Developability | Q | Q | Q | Q | Q |
| Film aspect | Q | Q | Q | Q | Q |
| Adhesion in cross hatch test | Q | Q | Q | Q | Q |
| Pencil hardness | 7 H | 7 H | 7 H | 7 H | 7 H |
| Punching behaviour | good | good | good | moderate | moderate |
| Solder resistance | >12 | >12 | <6 | <4 | <4 |
| Ni/Au stability | Q | Q | Q | Q | Q |
| Thermal cycling −40° C. to 125° C. | >300 cycles | >300 cycles | <200 cycles | <100 cycles | <100 cycles |

It is evident that the compositions 1 and 2 according to the present invention are significantly more stable with respect to temperature changes compared to the formulations of the prior art (Comparative Examples 3 to 5). Further the composition according to the invention show a significantly increased temperature resistance.

Development Test

Each formulation is exposed through a photomask to ultraviolet light at a wavelength of 365 nm and in a dose of 200-400 mJ/cm2 (measured by ORC light meter). The development is carried out with a alkaline developing solution (0.1% NaCO3) for 60-70 sec. under a spray pressure of 2 kg/cm². After the development, the unexposed areas of the board are checked for complete removal of the resist:

Q: complete removal after development achieved
R: Undeveloped material remains on the unexposed areas
Film aspect After Exposure and Development
Each test board is exposed to ultraviolet light at a wavelength of 365 nm and in a dose of 200-400 mJ/cm² (measured by ORC light meter). After the development with a alkaline developing solution (0.1% NaCO3) for 60-70 sec. under a spray pressure of 2 kg/cm2, the state of the film thus formed is checked visually.

Q: No change observable
R: Slight change of surface observable
Adhesion Test According to DIN 53151
The test board is exposed through a photomask to ultraviolet light at a wavelength of 365 nm and in a dose of 200-400 mJ/cm2 (measured by ORC light meter). The development is carried out with a weakly alkaline developing solution (0.1% NaCO3) for 60-70 sec. under a spray pressure of 2 kg/cm2. The developed test boards are thermal cured for 1 h at 150° C. Each test board thus obtained is subjected to a cross hatch test and subjected to a peel test with a cellophane adhesive tape. The test boards are then checked visually and the result is assessed according to the following criteria:

Q: 100/100 no peeling observable
R: 100/100 slight peeling observable

Pencil Hardness Test

The same test board used in the adhesion test is subjected to a hardness test by the method of Wolf-Wilborn complying with ASTM D3363, ESCA-T4-1, BS 3900-E19, ISO 15184.

Solder Resistance Test

According to IPC SM840 Rev. 8 point 3.7.1.

The test board is solder floated for 10 sec. in a solder batch at 288° C.

The condition of the film is then visually checked according to the following criteria:

Number of testcycles without deficiency (solder creeping per side).

Metalization Stability Test (Ni/Au Stability)

The test board is the same as used in the adhesion test. This is metallized for 25 min at 85° C. and a pH-value of 5.0 in a nickel bath to apply nickel in a thickness of 4.0 to 6.0 μm. Subsequently it is plated in a gold bath Acrotech® SF for 12 min at 85° C. and a pH-value of 4.5 to apply gold in a thickness of 0.05-0.08 μm. The condition of the film is assessed under the same criteria as for the solvent resistance test.

Q: No change observable
R: Slight change of surface observable

Thermal Cycling Test

Each formulation is exposed through a photomask to ultraviolet light at a wavelength of 365 nm and in a dose of 200-400 mJ/cm$^2$ (measured by ORC light meter). The development is carried out with a aqueous alkaline developing solution (0.1% NaCO3) for 60-70 sec under a spray pressure of 2 kg/cm$^2$. The developed test boards are thermally cured for 1h at 150° C. The developed test board is placed in an apparatus for temperature change. The temperature is changed alternately from –40° C. to 125° C. in a rapid temperature change <10 sec with a holdtime of 20 min. The formation of cracks is checked after 100 cycles. If a crack is observed, the test is terminated.

The invention claimed is:

1. Method for the preparation of a photocurable resin by a reaction comprising the following steps:
   i) reacting a mixture of a novolak type epoxy resin (A) represented by formula (I)

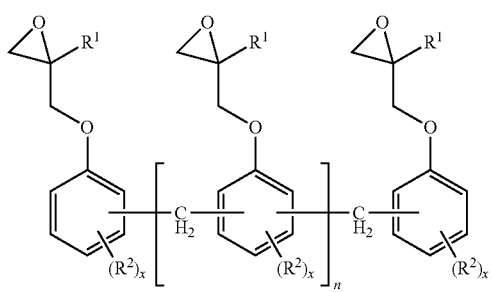

(I)

wherein $R^1$ is independently selected from H or $CH_3$; $R^2$ is independently selected from $C_{1-4}$ alkyl or halogen; x is an integer from 0 to 2; n is an integer from 2 to 12;

and a dicyclopentadiene-phenol glycidylether resin (B) represented by formula (II)

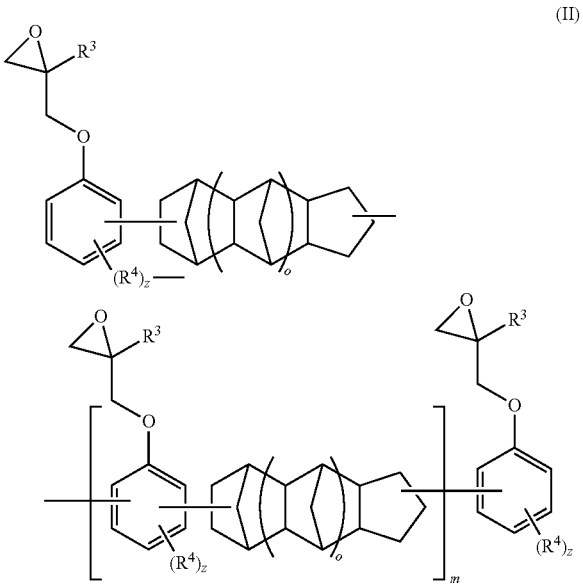

(II)

wherein $R^3$ is independently selected from H or $CH_3$; $R^4$ is independently selected from $C_{1-4}$ alkyl or halogen; z is an integer from 0 to 2; m is an integer from 0 to 10; o is an integer from 0 to 2 with ii) an advancement component (C) selected from the group consisting of bisphenol A, bisphenol F, bisphenol S and resorcinol;

iii) reacting with crotonic acid, cinnamic acid or acrylic acid (D); and iv) esterification of the unsaturated group containing resin obtained from the steps of i) to iii) with a carboxylic acid anhydride selected from the group consisting of succinic anhydride, maleic anhydride, glutaric anhydride, tetrahydrophthalic anhydride, itaconic anhydride, phthalic anhydride, hexahydrophthalic anhydride, methylhexahydrophthalic anhydride, ethyl-hexahydrophthalic anhydride, methyl-tetrahydrophathalic anhydride and ethyl-tetrahydrophthalic anhydride (E)

wherein the weight ratio of novolak type epoxy resin (A) to dicyclopentadiene-phenol glycidylether resin (B) is from 5 to 2:1.

2. Method according to claim 1, characterized in that step ii) is carried out after step iii) or steps ii) and iii) are conducted at the same time.

3. Method according to claim 1 wherein the advancement component (C) is present in an amount of 0.01 to 0.10 mol based on one chemical equivalent of epoxy groups from the mixture comprising (A) and (B).

4. Method according to claim 1 wherein the novolak type epoxy resin (A) is epoxy cresol novolak.

5. Method according to claim 1 wherein the epoxy resin (B) is a glycidylated addition product of dicyclopentadiene and phenol.

6. Photocurable resin obtainable by a process according to claim 1.

7. Photocurable resin according to claim 6 wherein the acid value is from 0.7 to 0.9 equivalents per kg.

8. Photocurable composition comprising a photocurable resin according to claim 6, a photopolymerization initiator and a diluent.

9. Method of forming a resist pattern comprising the following steps:
   (a) providing a photocurable composition comprising a photocurable resin according to claim 6, a photopolymerization initiator and a diluent;
   (b) applying said photocurable composition on a printed circuit board;
   (c) heat-drying said photocurable composition and forming a photoresist layer on the board;
   (d) selectively exposing said photoresist layer with light to cure an exposed portion thereof; and
   (e) developing the photoresist layer by removing a non-exposed portion thereof.

10. Photocured composition obtained by photocuring the photocurable resin according to claim 6.

\* \* \* \* \*